(12) United States Patent
Jung et al.

(10) Patent No.: US 11,415,876 B2
(45) Date of Patent: Aug. 16, 2022

(54) METHOD OF FABRICATING A PHOTOMASK

(71) Applicant: SAMSUNG ELECTRONICS CO., LTD., Suwon-si (KR)

(72) Inventors: Kangmin Jung, Seoul (KR); Sangwook Park, Hwaseong-si (KR); Youngdeok Kwon, Suwon-si (KR); Myungsoo Noh, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 140 days.

(21) Appl. No.: 17/030,941

(22) Filed: Sep. 24, 2020

(65) Prior Publication Data

US 2021/0181617 A1    Jun. 17, 2021

(30) Foreign Application Priority Data

Dec. 17, 2019  (KR) .......................... 10-2019-0168610

(51) Int. Cl.
*G03F 1/36* (2012.01)
*G03F 1/22* (2012.01)

(52) U.S. Cl.
CPC . *G03F 1/36* (2013.01); *G03F 1/22* (2013.01)

(58) Field of Classification Search
CPC .................................... G03F 1/22; G03F 1/36
USPC ........................................................... 430/5
See application file for complete search history.

(56) References Cited

U.S. PATENT DOCUMENTS

| 8,443,308 | B2 | 5/2013 | Shiely et al. |
| 8,631,360 | B2 | 1/2014 | Wang et al. |
| 8,782,572 | B1 | 7/2014 | Huang et al. |
| 9,715,170 | B2 | 7/2017 | Jang et al. |
| 10,036,961 | B2 | 7/2018 | Jang et al. |
| 10,962,874 | B2 * | 3/2021 | Misaka ................. G03F 7/2004 |

FOREIGN PATENT DOCUMENTS

| JP | 5477132 | 2/2014 |
| KR | 10-2009-0034539 | 4/2009 |
| KR | 10-2009-0099404 | 9/2009 |
| KR | 10-2016-0031831 | 3/2016 |
| KR | 10-1999865 | 7/2019 |

* cited by examiner

*Primary Examiner* — Christopher G Young
(74) *Attorney, Agent, or Firm* — F. Chau & Associates, LLC

(57) ABSTRACT

The present disclosure relates to a fabrication method of a photomask. The method of fabricating a photomask provides for a layout of patterns to be designed. The layout of patterns may be formed on a wafer on which chips are formed. The layout of patterns are corrected to provide a layout of a photoresist pattern serving as an etching mask for forming the patterns on the wafer while generating a flare map of the patterns. An optical proximity correction (OPC) may be performed at a chip level on the corrected layout of patterns to perform a secondary correction of the layout of patterns. A second OPC may be performed at a level of a shot which includes a plurality of ones of the chips by reflecting the flare map on the second corrected layout of patterns to a third corrected layout of patterns.

20 Claims, 5 Drawing Sheets

METHOD OF FABRICATING A PHOTOMASK

CROSS-REFERENCE TO RELATED APPLICATION

This application claims priority under 35 USC § 119 to Korean Patent Application No. 10-2019-0168610, filed on Dec. 17, 2019 in the Korean Intellectual Property Office (KIPO), the contents of which are incorporated by reference herein in their entirety.

BACKGROUND

1. Field

Example embodiments relate to a method of photolithography. More particularly, example embodiments relate to a method of fabricating a photomask using optical proximity correction (OPC).

2. Description of the Related Art

Photolithography is a process used to create small patterns on thin film during the creation of semiconductor devices. Light is used to create patterns on a substrate with a photomask. The photomask is an engineered pattern that allows light to pass through some parts and does not allow light to pass through other parts, creating the patterns.

Extreme ultraviolet (EUV) light may be shone onto the photomask and substrate to create the patterns. In some cases, the EUV process may produce a flare phenomenon. A flare phenomenon occurs when light is scattered from rough area of the mirror surface of the substrate. A mask shadowing effect may occur as a result of the flare phenomenon based on the incidence of light and the shape of the slit of the equipment.

Manufacturing defects may occur due to the flare phenomenon and shadowing effect, which may increase the total manufacturing time and error rate. Therefore, there is a need in the art for systems and methods that reduce flare phenomena in photo processes using EUV equipment.

SUMMARY

Example embodiments provide a method of fabricating a photomask using a method of optical proximity correction (OPC).

According to example embodiments, there is provided a method of fabricating a photomask. The method may include designing a layout of patterns to be formed on a wafer on which chips are formed; generating a flare map of the patterns; performing a first correction of the layout of patterns to produce a layout of a photoresist pattern serving as an etching mask while generating the flare map; performing a first optical proximity correction (OPC) at a chip level, wherein the first OPC comprises a second correction of the layout of patterns; and performing a second OPC at a shot level by reflecting the flare map on layout of patterns, wherein the second OPC comprises a third correction of the layout of patterns.

According to example embodiments, there is provided a method of fabricating a photomask. The method may include designing a layout of patterns to be formed on a wafer on which chips are formed; while performing a preliminary operation of a first OPC at a shot level including a plurality of chips, performing a first correction of the layout of patterns to produce a layout of a photoresist pattern serving as an etching mask for forming the patterns on the wafer so that the patterns have the designed layout of patterns; and performing a second OPC at a chip level on the layout of patterns, wherein the second OPC comprises a second correction of the layout of patterns; and performing the first OPC at the shot level by reflecting a result of the preliminary operation of the first OPC on the layout of patterns, wherein the first OPC comprises a third correction of the layout of patterns.

According to example embodiments, there is provided a method of fabricating a photomask. The method may include designing a layout of patterns to be formed on a wafer on which chips are formed; while generating a flare map of the patterns, performing a first correction on the layout of patterns to provide a layout of a photoresist pattern serving as an etching mask for forming the patterns on the wafer so that the patterns have the designed layout on the wafer; performing second correction including a first OPC at a chip level on the layout of patterns; and verifying the layout of patterns based on the second correction; performing third correction including a second OPC at a shot level by reflecting the flare map on the layout of patterns based on the second correction; verifying the layout of patterns based on the third correction; and requesting fabrication of a mask based on the third correction.

According to example embodiments, there is provided a method of fabricating a photomask. The method may include designing a layout of patterns for a chip wafer; generating a flare map based on the layout of patterns; performing a first correction on the layout of patterns during a time period for generating the flare map; and performing a second correction on the layout of patterns based on the flare map.

In the method of fabrication of the photomask in accordance with example embodiments, OPCs for solving OPE may be divided into two groups in an aspect of sizes of areas on which the OPE may have an influence, for example, a first group for an OPE with an influence on a small area such as a chip and a second group for an OPE with an influence on a large area such as a shot, and the first and second groups of OPCs may be separately performed so as to reduce the time for fabrication of the photomask.

DESCRIPTION OF EMBODIMENTS

Figure 1:
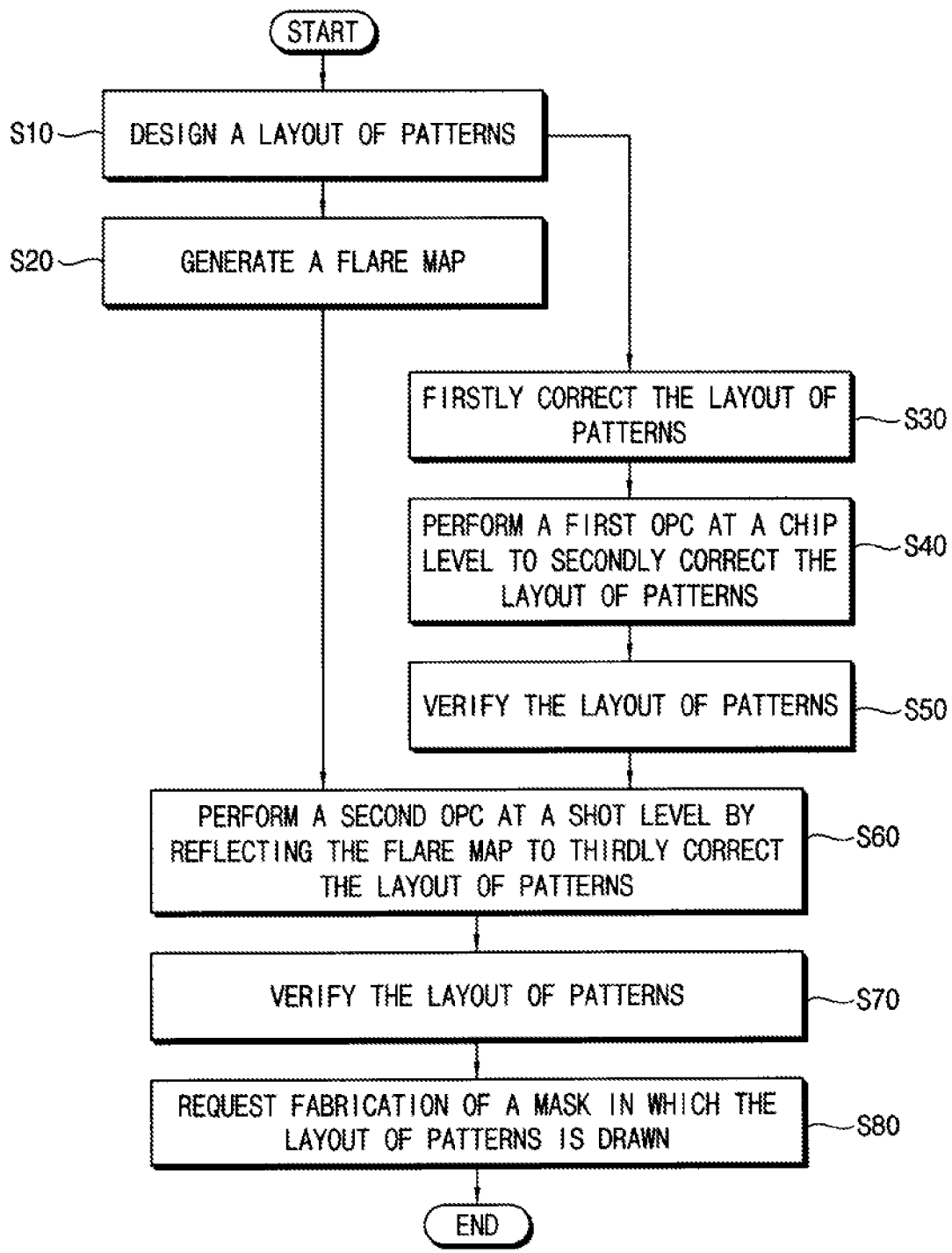
FIG. 1 is s flowchart illustrating a method of fabricating a photomask using OPC in accordance with example embodiments.

The present disclosure relates generally to photolithography. Embodiments of the present disclosure provide a fabrication method of a photomask. Certain embodiments relate to the handling of intrusive phenomena (e.g., flare phenomenon) that occur during the manufacturing process of a photomask. Flare in an extreme ultraviolet (EUV) lithography system refers to unwanted scattered light that appears beneath dark features and degrades the image contrast provided by a photomask.

As sizes of patterns on a wafer are reduced, optical proximity effects (OPE) may occur more frequently due to neighboring patterns becoming closer when the exposure process is performed using a photomask. Thus, the layout of patterns formed by etching an etching target layer using a photoresist pattern may not be the same as the photoresist pattern itself due to OPE, characteristics of the etching process, or misalignment. Therefore, the layout of the photoresist pattern may be corrected so that final patterns may have a desired layout, in consideration of the characteristics of the etching process and a process margin.

For example, an optical proximity correction (OPC) may be performed to address the OPE. In some cases, deep ultraviolet light (DUV) equipment may be used for the exposure process. However, EUV equipment may also be used to provide a higher resolution. When EUV equipment is used, the flare phenomenon may be intensified. For example, light scattering may be generated by roughness on the mirror surface of the wafer. A mask shadowing effect may also occur due to the oblique incidence of light and the arc-shaped slit.

According to embodiments of the present disclosure, correction performed at a chip level may be performed in parallel with the generation of the flare map. After the generation of the flare map, correction of the flare phenomenon and correction of the mask shadowing effect may be performed at a shot level. Therefore, OPCs performed at a chip level and OPCs performed at a shot level may be separated. As a result of performing the OPCs at the chip level during the generation of the flare map, a process time may be reduced. In some cases, the time for performing the OPCs at the shot level is reduced, therefore reducing the total time for the OPCs.

For example, a layout of patterns may be formed on a wafer on which chips are to be formed. The layout of patterns may then be corrected to provide a photoresist pattern serving as an etching mask for forming the patterns on the wafer. A flare map of the patterns may also be generated. A secondary correction of the layout of patterns may then be performed on the corrected layout of patterns, including an optical proximity correction (OPC). In some cases, a second OPC may be performed by reflecting the flare map on the second corrected layout of patterns to produce a third corrected layout of patterns.

Patterns on a wafer may be formed by creating an etching target layer on the wafer, forming a photoresist layer on the etching target layer, patterning the photoresist layer to form a photoresist pattern, and etching the etching target layer using the photoresist pattern as an etching mask. An etching mask layer may be further formed between the etching target layer and the photoresist layer. In this case, the etching mask layer may be etched using the photoresist pattern to form an etching mask and the etching target layer may be etched using the etching mask.

The formation of the photoresist pattern by patterning the photoresist layer may include disposing a photomask, performing an exposure process, and performing a developing process. For example, disposing a photomask may include using a reticle on which a layout of patterns is drawn above the photoresist layer. The exposure process may include emitting light from a light source to pass through the photomask to the photoresist layer. The developing process may include removing an exposed or unexposed portion of the photoresist layer so the layout of patterns may be transferred from the reticle to the photoresist layer.

In some examples of the present disclosure, the OPC may be performed on each chip on a wafer, i.e., at a chip level. Additionally or alternatively, the OPC may be performed on a plurality of chips covered by a shot in an exposure equipment, i.e., at a shot level. For example, shot level OPC may be used to correct a rounding phenomenon that may occur at corners of patterns. Thus, the OPC may be performed by adding a hammerhead or serif to a layout of patterns performed at a chip level.

In some cases, an OPC may be performed on one chip, and may then be applied to other chips in the same shot. However, for flare phenomenon that may occur due to light scattering from surface roughness of a mirror, reflecting a light emitted from a light source to a photomask, the flare phenomena of chips covered by one shot may be different from each other. Therefore, the OPC may be performed not at a chip level but at a shot level.

In one embodiment, an OPC for solving the flare phenomenon may be performed by detecting a flare level of patterns used to calculate a point spread function (PSF), performing a convolution integral of the PSF and a density of the patterns to generate a flare map, and reflecting the flare map to the layout of the patterns.

Additionally or alternatively, an OPC may be performed at a shot level to a solve mask shadowing effect that may occur by changing a critical dimension (CD) of patterns depending on the position of a slit for limiting light to a given area of a photomask. The slit may have an arc shape when the light is incident to the photomask is not at a right angle but, for example, at about 6 degrees with respect to a normal line of the photomask.

Simultaneously performing an OPC to address the corner rounding phenomenon, to correct the flare phenomenon, and to solve the mask shadowing effect may be time intensive. Thus, the OPC used to solve the corner rounding phenomenon may be performed at a chip level, the OPC used to correct the flare phenomenon may be performed by reflecting the flare map to the layout of the patterns, and the OPC used to solve the mask shadowing effect may be performed at a shot level.

Methods of fabricating a photomask will be more clearly understood from the following detailed description taken in conjunction with the accompanying drawings. Hereinafter, a method of fabricating a photomask using OPC will be illustrated in detail.

FIG. 1 is s flowchart illustrating a method of fabricating a photomask using OPC in accordance with example embodiments, and FIGS. 2 to 5 are plan views illustrating correction of a layout of patterns in accordance with example embodiments.

Figure 2:
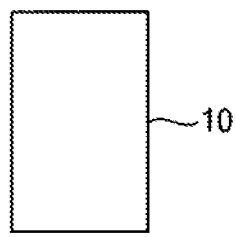
FIGS. 2 to 5 are plan views illustrating correction of a layout of patterns in accordance with example embodiments.
Figure 2:
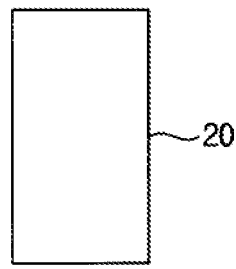
Figure 2:
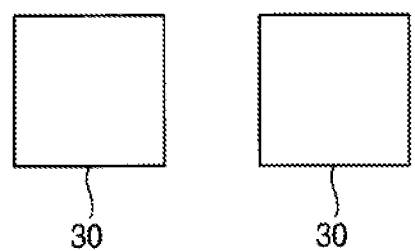

Referring to FIGS. 1 and 2, in a first step S10, a layout of patterns to be formed on a wafer (i.e., on which chips may be formed) may be designed. The layout of patterns may be a desired layout of patterns to be formed on the wafer.

For example, FIG. 2 shows that a design for a layout of first to third patterns 10, 20, and 30 spaced apart from each other, each of which may have a shape of a rectangle. A distance between the second and third patterns 20 and 30 may be smaller than a distance between the first and second patterns 10 and 20. The third pattern 30 may include two parts with the same size and space apart from each other.

In a second step S20, a flare map of the patterns may be generated. The flare map may be generated by detecting a flare level of the patterns to calculate a PSF, and performing a convolution integral of the PSF and a density of the patterns.

Figure 3:
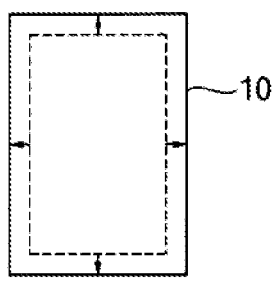
Figure 3:
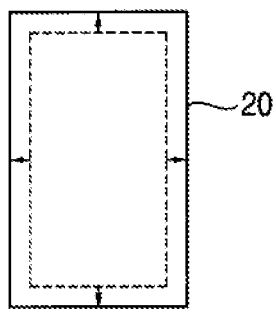
Figure 3:
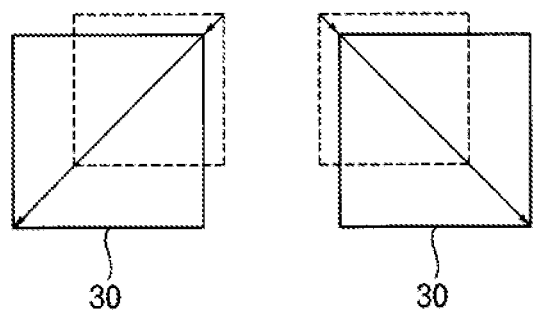

Referring to FIGS. 1 and 3, in a third step S30, the layout of patterns may be firstly corrected to become a layout of a photoresist pattern serving as an etching mask for forming the patterns on the wafer.

For example, after patterning a photoresist layer to form the photoresist pattern, an etching target layer on the wafer may be etched using the photoresist pattern as an etching mask to form the patterns on the wafer. However, the patterns may have a layout different from the layout of the photoresist pattern due to the characteristics of the etching process and the misalignment during the etching process. Therefore, in consideration of the difference between the layout of the patterns that may be formed on the wafer and the layout of the photoresist pattern and the process margin, the layout of patterns designed in the first step S10 may be corrected to be a layout that may be applied to the photoresist layer. Therefore, the patterns on the wafer may have a desired layout from the layout of the photoresist pattern.

For example, FIG. 3 shows the sizes of the first to third patterns 10, 20 and 30 are enlarged and the distance between the second and third patterns 20 and 30 less than the distance between the first and second patterns 10 and 20 is elongated. However, the inventive concept may not be limited thereto, and for example, the sizes of the first to third patterns 10, 20 and 30 may be reduced. Additionally or alternatively, the distance between the second and third patterns 20 and 30 may be reduced.

Figure 4:
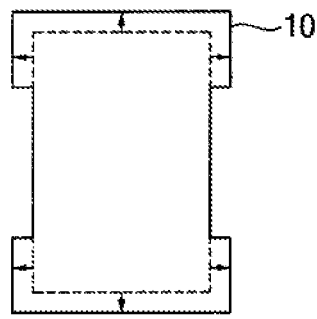
Figure 4:
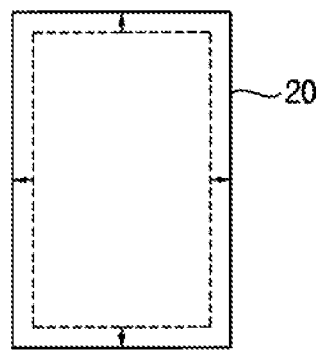
Figure 4:
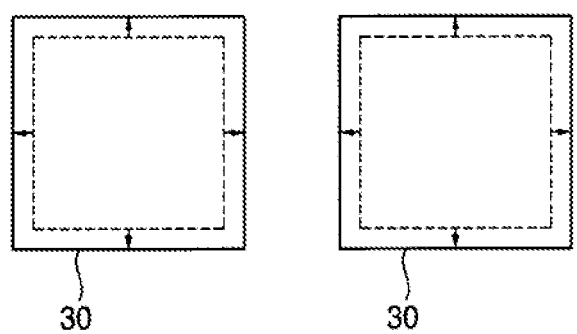

Referring to FIGS. 1 and 4, in a fourth step S40, a first OPC may be performed at a chip level on the firstly corrected layout of patterns to secondly correct the layout of patterns.

In example embodiments, the first OPC may include correcting corner rounding phenomenon of the firstly corrected layout of patterns, which may include, e.g., adding a hammerhead or serif to the layout of patterns.

For example, FIG. 4 shows a hammerhead is added to upper and lower ends of the first pattern 10 and the sizes of the second and third patterns 20 and 30 are expanded, however, the inventive concept may not be limited thereto.

The corner rounding phenomenon may be the same at respective chips. Therefore, the correction may be performed on one chip, and may be applied to other chips in the same shot so that the correction may be performed on the entire chips in the same shot. In the fourth step S40, some or all OPCs that may be performed at a shot level, including the correction for solving the corner rounding phenomenon, may be performed before OPCs performed at a chip level.

In a fifth level S50, the secondly corrected layout of patterns may be verified.

For example, layout of patterns secondly corrected by the first OPC may be verified to be within a predetermined error range through, e.g., a contour simulation. The first OPC may be performed again after modifying some of data if the layout of patterns is not within the predetermined error range. The modification and verification may be repeatedly performed until the layout of patterns may be within the predetermined error range.

In example embodiments, the third to fifth steps S30, S40 and S50 may be performed in parallel with the second step S20 within a processing time for performing the second step S20. Therefore, if the processing time for the second step S20 is longer than the third to fifth steps S30, S40 and S50, less time may be used to perform the third to fifth steps S30, S40 and S50 in parallel with the second step S20 compared to the third to fifth steps S30, S40, and S50 after performing the second step S20.

Figure 5:
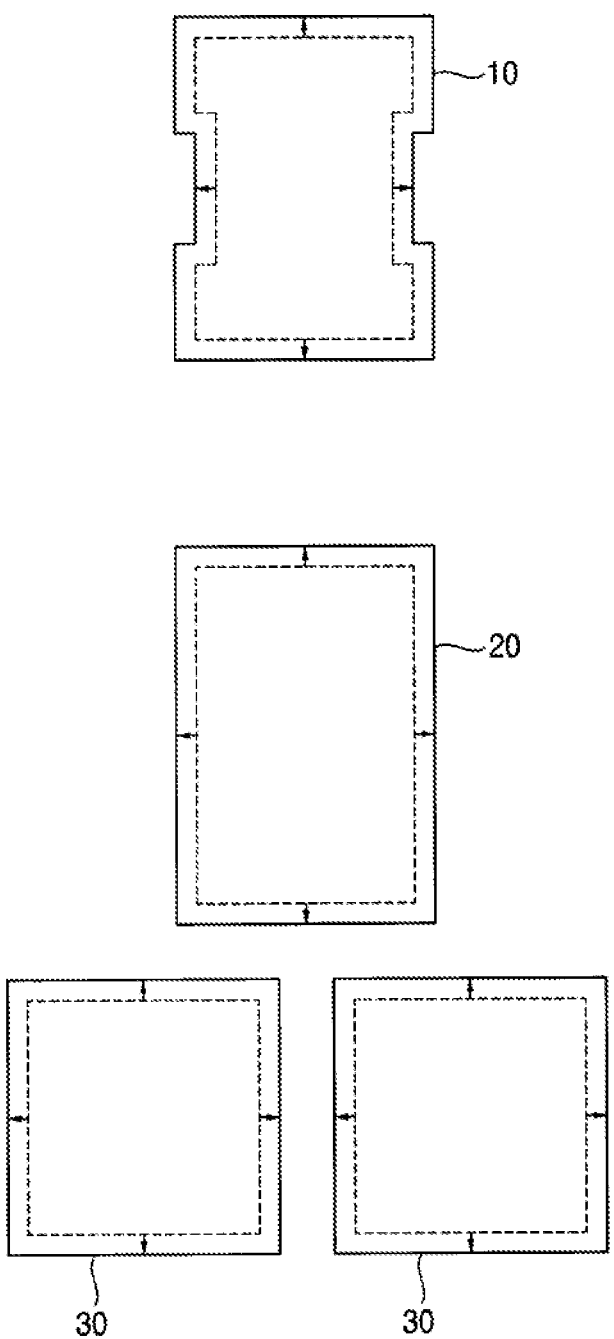

Referring to FIGS. 1 and 5, in a sixth step S60, a second OPC may be performed at a shot level by, e.g., reflecting the flare map generated in the second step S20 on the secondly corrected layout of patterns, so that the layout of patterns may be thirdly corrected. Therefore, distortion of the patterns due to the flare phenomenon may be corrected.

The second OPC may further include correcting mask shadowing effect generated by an oblique incidence of EUV onto a photomask and an arc-shaped slit in the photomask. For example, the second OPC may include various types of OPC that may be performed at a shot level, except for OPCs that may be performed at a chip level.

For example, FIG. 5 shows the sizes of the first to third patterns 10, 20 and 30 are increased by the second OPC. However, the inventive concept may not be limited thereto. Therefore, the sizes of the first to third patterns 10, 20 and 30 may be partially increased, shapes of the first to third patterns 10, 20 and 30 may be changed, or the distances therebetween may be changed.

In a seventh step S70, the thirdly corrected layout of patterns may be verified, which may be performed by a method substantially the same as or similar to the fifth step S50. Therefore, the modification and verification may be repeatedly performed until the layout of patterns may be within the predetermined error range.

In an eighth step S80, fabrication of a mask on which the thirdly corrected layout of patterns may be requested. For example, data obtained by the corrections as a result of correcting the initial layout of patterns three times may be transferred to the next stage to fabricate a photomask.

Thus, a method of fabricating a photomask may include designing a layout of patterns for a chip wafer; generating a flare map based on the layout of patterns; performing a first correction on the layout of patterns during a time period for generating the flare map; and performing a second correction on the layout of patterns based on the flare map.

In some cases, the method may further include performing a first OPC on the layout of patterns after the first correction, wherein the first OPC is performed during the time period, the first OPC is performed at a chip level, and the second correction comprises a second OPC performed at a slot level. In some cases, the method may further include performing a first verification of the layout of patterns during the time period based on the first correction; and performing a second verification of the layout of patterns based on the second correction.

By the above processes, the photomask may be fabricated, and a photoresist layer may be transformed into a photoresist pattern with the desired layout shown in FIG. 3, by performing an exposure process using the fabricated photomask and a developing process. An etching target layer may be etched using the photoresist pattern as an etching mask to form patterns with the desired layout shown in FIG. 2.

As illustrated above, in the first step S10, a layout of patterns that may be formed on a wafer on which chips may be formed may be initially designed in the first step S10; in the second step S20, a preliminary operation, which may be performed at a level of a shot including a plurality of ones of the chips, for a second OPC, for example, generation of a flare map may be performed; in the third step S30, the layout of patterns may be firstly corrected to be a layout of patterns of a photoresist layer that may be formed on the wafer serving as an etching mask so that the patterns may be formed on the wafer to have the initial layout; in the fourth step S40, a first OPC may be performed at a chip level on the firstly corrected layout of patterns to secondly correct the layout of patterns; in the fifth step S50, the secondly corrected layout of patterns may be verified; and the third to fifth steps S30, S40 and S50 may be performed in parallel with the second step S20.

In the sixth step S60, the preliminary operation for the second OPC, for example, the generated flare map, may be reflected on the secondly corrected layout of patterns to perform the second OPC to thirdly correct the layout of patterns. In the seventh step S70, the thirdly corrected layout of patterns may be verified. In the eighth step S80, fabrication of a mask on which the thirdly corrected layout of patterns is drawn may be requested.

As illustrated above, during the operation of the second step S20, the preliminary operation for the second OPC performed at a shot level, the operation of the fourth step S40, and the first OPC at a chip level may be performed in parallel to utilize the extra time. After the second step S20, the operation of the sixth step S60, for example, the second OPC may be performed at a shot level by using the result of the preliminary operation. Therefore, when compared to performing the operations of the fourth and sixth steps S40 and S60 at a shot level after the operation of the second step S20, less time may be used to perform the operations of the fourth and sixth steps S40 and 60 during the operation of the second step S20. Time usage may be reduced by at least the time of the operation of the first OPC, which may reduce the time used to fabricate the photomask.

Further, in some cases the verification of the first OPC in the fifth step S50 may be performed in parallel with the operation of the second step S20 before the fourth and sixth steps S40 and S60. Therefore, the time for the verification of the seventh step S70 in which the layout of patterns may be finally verified may be reduced, which may reduce the fabrication time of the photomask.

For example, one shot may be assumed to cover nine chips, and performing the first and second OPCs may take 10 unit times and 5 unit times, respectively. Embodiments of the present disclosure use 9*(10+5)=135 unit times to perform the first and second OPCs at a shot level altogether. However, in example embodiments, 9*5=45 unit times may be used to perform the first OPC during the operation of the second step S20 and the second OPC at a shot level after the operation of the second step S20, because performing the first OPC does not use additional time.

Accordingly, in the fabrication of the photomask in accordance with example embodiments, OPCs for solving OPE may be divided into two groups in an aspect of sizes of areas on which the OPE may have an influence, for example, a first group for an OPE with an influence on a small area such as a chip and a second group for an OPE with an influence on a large area such as a shot, and the first and second groups of OPCs may be separately performed to complete the OPCs in a reduce process time.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of fabricating a photomask, the method comprising:
designing a layout of patterns to be formed on a wafer on which chips are formed;
generating a flare map of the patterns;
performing a first correction of the layout of patterns to produce a layout of a photoresist pattern serving as an etching mask while generating the flare map;
performing a first optical proximity correction (OPC) at a chip level, wherein the first OPC comprises a second correction of the layout of patterns; and
performing a second OPC at a shot level by reflecting the flare map on layout of patterns, wherein the second OPC comprises a third correction of the layout of patterns.

2. The method of claim 1, wherein the first correction and the second correction are performed in parallel during a time for the generation of the flare map.

3. The method of claim 1, wherein the second OPC includes correcting a mask shadowing effect.

4. The method of claim 1, further comprising:
verifying the layout of patterns after the third correction.

5. The method of claim 4, further comprising:
requesting fabrication of a mask in which the layout of patterns is drawn after verifying the layout of patterns.

6. The method of claim 1, further comprising:
verifying the layout of patterns after the second correction.

7. The method of claim 1, wherein the flare map is generated by calculating a point spread function (PSF) of a flare level for the patterns, and performing a convolution integral of the PSF and a density of the patterns.

8. The method of claim 1, wherein the first correction includes changing sizes of the patterns or distances between the patterns.

9. The method of claim 8, wherein the first correction is performed based on a difference between a layout of the photoresist pattern and a layout of an etching target layer when the etching target on the wafer is etched using the photoresist pattern.

10. The method of claim 1, wherein the first OPC includes correcting a corner rounding phenomenon.

11. A method of fabricating a photomask, the method comprising:
designing a layout of patterns to be formed on a wafer on which chips are formed;
while performing a preliminary operation of a first OPC at a shot level including a plurality of chips,
performing a first correction of the layout of patterns to produce a layout of a photoresist pattern serving as an etching mask for forming the patterns on the wafer so that the patterns have the designed layout of patterns; and
performing a second OPC at a chip level on the layout of patterns, wherein the second OPC comprises a second correction of the layout of patterns; and
performing the first OPC at the shot level by reflecting a result of the preliminary operation of the first OPC on the layout of patterns, wherein the first OPC comprises a third correction of the layout of patterns.

12. The method of claim 11, wherein the preliminary operation of the first OPC at the shot level includes generating a flare map of the patterns, and
wherein reflecting the result of the preliminary operation of the first OPC is based on the second correction.

13. The method of claim 12, wherein the flare map is generated by calculating a point spread function (PSF) of a flare level about the patterns, and performing a convolution integral of the PSF and a density of the patterns.

14. The method of claim 11, wherein the first OPC further includes correcting a mask shadowing effect generated by an oblique incidence of EUV and an arc-shaped silt.

15. The method of claim 11, further comprising verifying the layout of patterns after the second correction,
wherein the first correction, the second correction, and verifying the layout of patterns are performed within a time for performing the preliminary operation of the first OPC, and
wherein the method further comprises:
verifying the layout of patterns after the third correction; and
requesting fabrication of a mask based on the verified layout of patterns.

16. The method of claim 11, wherein the first correction includes changing sizes of the patterns or distances between the patterns based on a difference between a layout of the photoresist pattern and a layout of an etching target layer when the etching target on the wafer is etched using the photoresist pattern.

17. The method of claim 11, wherein the second OPC includes correcting a corner rounding phenomenon.

18. A method of fabricating a photomask, the method comprising:
designing a layout of patterns to be formed on a wafer on which chips are formed;
while generating a flare map of the patterns,
performing a first correction on the layout of patterns to provide a layout of a photoresist pattern serving as an etching mask for forming the patterns on the wafer so that the patterns have the designed layout on the wafer;
performing second correction including a first OPC at a chip level on the layout of patterns; and
verifying the layout of patterns based on the second correction;
performing third correction including a second OPC at a shot level by reflecting the flare map on the layout of patterns based on the second correction;
verifying the layout of patterns based on the third correction; and
requesting fabrication of a mask based on the third correction.

19. The method of claim 18, wherein the second OPC further includes correcting a mask shadowing effect generated by an oblique incidence of EUV and an arc-shaped silt.

20. The method of claim 18, wherein the first correction includes changing sizes of the pattern or distances therebetween.

* * * * *